United States Patent
Grugel

(10) Patent No.: US 6,802,999 B1
(45) Date of Patent: Oct. 12, 2004

(54) METHOD OF FABRICATING PROTECTIVE COATING FOR A CRUCIBLE WITH THE COATING HAVING CHANNELS FORMED THEREIN

(75) Inventor: Richard N. Grugel, Huntsville, AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 323 days.

(21) Appl. No.: 10/173,536

(22) Filed: Jun. 13, 2002

(51) Int. Cl.⁷ .......................... B05D 1/32; B29C 41/08; B29C 41/20; C23C 16/00; C25D 5/02

(52) U.S. Cl. .................. 264/81; 205/122; 205/135; 205/205; 264/101; 264/129; 264/279; 264/317; 427/248.1; 427/250; 427/255.11; 427/282; 427/287; 427/300; 427/372.2; 427/383.5; 427/383.7; 427/389.7; 427/393.6

(58) Field of Search .......................... 264/39, 81, 101, 264/129, 279, 317; 205/122, 135, 205; 427/248.1, 250, 255.11, 282, 287, 300, 372.2, 383.5, 383.7, 389.7, 393.6

(56) References Cited

U.S. PATENT DOCUMENTS

| | | |
|---|---|---|
| 4,049,250 A | 9/1977 | Schmidt |
| 4,058,579 A | 11/1977 | Lashway |
| 4,090,851 A | 5/1978 | Berkman et al. |
| 4,159,891 A | 7/1979 | Schmidt et al. |
| 4,466,818 A | 8/1984 | Brongersma |
| 4,936,949 A | 6/1990 | Kida et al. |
| 5,158,750 A | 10/1992 | Finicle |

FOREIGN PATENT DOCUMENTS

JP          6487591 A   *  3/1989   .................. 264/317

* cited by examiner

Primary Examiner—Leo B. Tentoni
(74) Attorney, Agent, or Firm—James J. McGroary; Peter J. Van Bergen

(57) ABSTRACT

A method is provided for the fabrication of a protective coating for a crucible with channels being formed in the coating. A material is adhered to the outer wall of the crucible to form a pattern thereon. The outer wall of the crucible along with the pattern of material adhered thereto is next coated with another material. The material used to form the pattern should extend through the outer material coating to define at least one port therein. Next, the crucible with its pattern of material and outer coating material is heated to a temperature of transformation at which the pattern of material is transformed to a fluidic state while the crucible and outer coating material maintain their solid integrity. Such transformation could also be accomplished by using a solvent that causes the pattern of material to dissolve. Finally, the material in its fluidic state is removed via the at least one port formed in the outer material coating thereby leaving channels defined in the coating adjacent the outer wall of the crucible.

41 Claims, 1 Drawing Sheet

METHOD OF FABRICATING PROTECTIVE COATING FOR A CRUCIBLE WITH THE COATING HAVING CHANNELS FORMED THEREIN

ORIGIN OF THE INVENTION

The invention was made was made by an employee of the United States Government and may be manufactured and used by or for the Government for governmental purposes without the payment of any royalties.

BACKGROUND OF THE INVENTION

1. Field of the Invention

This invention relates to methods of fabricating protective coatings for a crucible. More specifically, the invention is a method of fabricating a protective coating for a crucible where the method simultaneously creates multi-purpose channels within the coating and coupled to the crucible's outer wall.

2. Description of the Related Art

Crucibles are used as containers in a wide variety of metallurgic and crystal growing processes owing to their ability to withstand high heats while remaining inert with respect to the chemicals contained therein. Materials typically used for crucibles include ceramics (e.g., alumina, aluminum nitride, boron nitride, etc.) quartz and glass. The downside of these materials is their brittleness thereby necessitating some sort of protection for the crucible and its contents. Further, it is frequently necessary to heat/cool the crucible, measure temperatures thereon, or otherwise attach some sort of sensing mechanism thereto. Once again, this requires some sort of special set-up for each operation.

SUMMARY OF THE INVENTION

Accordingly, it is an object of the present invention to provide a method of fabricating a protective wall for a crucible while simultaneously providing the means to accommodate a variety of systems/processes requiring access to a portion of the crucible's outer wall.

Another object of the present invention is to provide a protective coating for a crucible with one or more channels being defined in the coating adjacent the crucible's outer wall.

Other objects and advantages of the present invention will become more obvious hereinafter in the specification and drawings.

In accordance with the present invention, a method of fabricating a protective coating for a crucible is provided where the coating has channels formed therein. The crucible is generally made from a material having a high melting temperature on the order of 1500° C. or greater. A material is adhered to the outer wall of the crucible to form a pattern thereon. This material should have a temperature of transformation that is less than the melting temperature of the crucible's material. The outer wall of the crucible along with the pattern of material adhered thereto is next coated with another material such that the crucible's outer wall along with the pattern of material adhered thereto are substantially covered. The material used to form the pattern should extend through the outer material coating to define at least one port therein. The outer material coating should have a melting temperature that is greater than the temperature of transformation of pattern of material adhered to the outer wall of the crucible. Next, the crucible with its pattern of material and outer coating material is heated to at least the temperature of transformation. Such transformation could also be accomplished by using a solvent that causes the pattern of material to dissolve. In either case, the pattern of material is transformed to a fluidic state. Finally, the material in its fluidic state is removed via the at least one port formed in the outer material coating thereby leaving channels defined in the coating adjacent the outer wall of the crucible. The outer coating material serves to protect the crucible while the resultant channels can be used for a variety of purposes.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
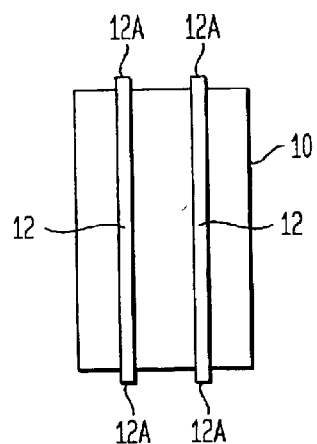
FIG. 1 is a side view of a crucible having straight runs of channel-forming material adhered thereto in accordance with an embodiment of the present invention.

Referring now to the drawings, and more particularly to FIG. 1, a side view of a crucible 10 is illustrated. Crucible 10 is any standard open or sealed crucible, the particular choice of which is not a limitation of the present invention. Typically, crucible 10 is made from a ceramic, quartz or glass material. Once again, the choice of material for crucible 10 is not a limitation of the present invention.

Applied or adhered to the outer wall of crucible 10 are one or more pieces of material 12 (e.g., two are shown) arranged in a desired pattern. In FIG. 1, pieces of material 12 define two contiguous, non-intersecting and substantially straight runs that extend along the length of crucible 10. Fewer or more pieces of material 12 could be used without departing from the scope of the present invention. Further, pieces of material 12 need not extend the full length of crucible 10 as shown. Preferably, pieces of material 12 are in the form of a strip or tape that can be self-adhesive on one side thereof, glued or otherwise held in place against the outer wall of crucible 10. However, pieces of material 12 could also be formed or otherwise molded onto crucible 10. The choices for pieces of material 12 are varied and will be discussed further below.

As will be explained further below, pieces of material 12 are eliminated during fabrication in accordance with the present invention. To facilitate such elimination, pieces of material 12 can have one or more free ends 12A that extend from crucible 10 as illustrated.

Figure 2:
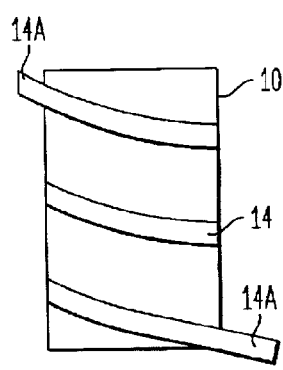
FIG. 2 is a side view of a crucible having helical runs of channel-forming material adhered thereto in accordance with another embodiment of the present invention.

The present invention is not limited to using pieces of material 12 extending contiguously and in a non-intersecting fashion along the entire length of crucible 10 as illustrated in FIG. 1. For example, FIG. 2 illustrates the use of a single piece of material 14 wrapped helically about crucible 10 all along its length. However, as in the previous embodiment, piece of material 14 need not extend all along the length of crucible 10. Further, more than one such piece of material could be helically wrapped about crucible 10 with successive wraps being parallel to or crossing one another. Still further, piece of material 14 can have free ends 14A that extend from crucible 10.

Figure 3:
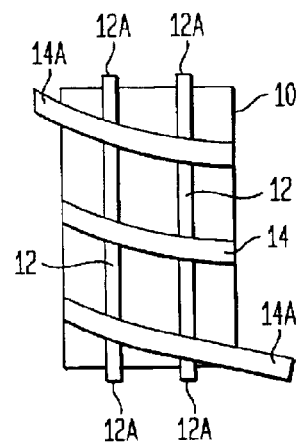
FIG. 3 is a side view of a crucible having both helical and straight runs of channel-forming material adhered thereto in accordance with yet another embodiment of the present invention.

In still another embodiment illustrated in FIG. 3, a combination of straight-run pieces of material 12 and helical-run piece of material 14 are applied/adhered to crucible 10 to form a grid-like pattern. The order of application of materials 12 and 14 is not a limitation of the present invention. The number and/or position of free ends 12A and 14A can be fewer or more than shown, and can further be selected to suit a particular application.

Figure 4:
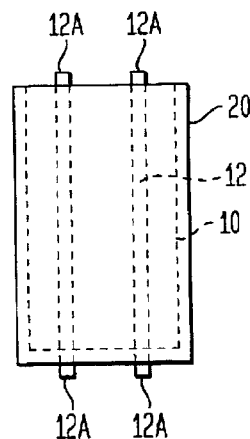
FIG. 4 is a side view of the crucible with the straight runs of channel-forming material illustrated in FIG. 1 and further coated with a protective material in accordance with the present invention.

Regardless of the pattern formed by pieces of material 12 and/or 14, the next step in the present invention is the coating of the outer wall of crucible 10 and pieces of material 12 and/or 14 with a material selected to protect the (brittle) crucible 10. For example, FIG. 4 illustrates the FIG. 1 embodiment coated with a protective material 20 such that crucible 10 and pieces of material 12 are contained therein. One or more of free ends 12A should extend from material 20 as illustrated.

Protective material 20 is typically a metal that is either electroplated or chemically vapor deposited in place. Note that if electroplating is used, a preliminary step of painting or otherwise depositing a very thin conducting layer (e.g., gold, silver, carbon, etc.) onto the outer wall of crucible 10 and pieces of material 12 is required as is known in the art. While material 20 is typically a metal, other materials can be used without departing from the scope of the present invention.

As mentioned above, the pieces of material 12 and/or 14 used to create a pattern on crucible 10 are eliminated after the crucible assembly has been coated with material 20 (FIG. 4). This can be accomplished by a simple heating process provided materials 12/14 and 20 satisfy the following criteria. Crucible 10 typically is made from a material having a very high melting temperature on the other of 1500° C. or greater. To utilize a heating step, the present invention requires choosing a material 20 that also has a high melting temperature and choosing a material for pieces 12 and/or 14 that has a temperature of transformation that is below the melting temperatures of crucible 10 and material 20. As used herein the term "temperature of transformation" is the temperature at which pieces of material 12 and/or 14 melt, vaporize, decompose to an ash or, in general, transform to a fluidic state in which the resultant material can readily change its shape and flow. To satisfy these criteria easily, pieces of material 12 and/or 14 are generally plastics, waxes, or low-ash fibrous materials while material 20 is a metal or other high melting temperature material. Transformation of pieces of material 12 and/or 14 can also be accomplished by exposing them to an appropriate solvent, i.e., without the use of heat. The solvent preferably dissolves pieces of material 12 and/or 14 without affecting crucible 10 or material 20.

Figure 5:
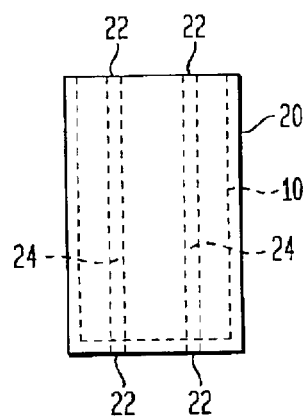
FIG. 5 is a side view of the crucible assembly in FIG. 4 after a heating step and a removal step in which the channel-forming material is transformed to a fluidic state and removed, respectively.

The resultant so-transformed pieces of material 12 and/or 14 are next removed from between crucible 10 and material 20. More specifically, as illustrated in FIG. 5, the protrusion of each free end 12A and/or 14A from material 20 creates ports 22 forming the entrance to channels 24 in material 20 adjacent the outer wall of crucible 10. The removal of the so-transformed pieces of material 12 and/or 14 can be facilitated by manipulating (e.g., shaking, turning, decanting, etc.) the crucible assembly in FIG. 5 so that the material exits ports 22. Another option is to couple a pressure source 30 to ports 22 as shown. Pressure source 30 can apply a higher than ambient pressure or lower than ambient pressure (i.e., vacuum) to one or more ports 22 to facilitate the removal operation. The resulting pressure along channels 24 (or portions thereof depending on their interconnectivity) causes the transformed material to be expelled (in the case of high pressure) or withdrawn (in the case of low or vacuum pressure).

The advantages of the present invention are numerous. Material 20 serves to protect crucible 10 while the resultant channels 24 can be used for a variety of purposes. For example, channels 24 can be used as pathways for solid objects such as small thermocouples or heat transfer strips. Channels 24 could also be used to transport heating and/or cooling fluids used to selectively heat and/or cool all or certain portions of what is in crucible 10. Channels 24 could also be filled with a gas and then sealed. Then, should crucible 10 fail, the gas would escape thereby serving as a means for detecting crucible failure.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A method of fabricating a protective coating for a crucible where the coating has channels formed therein, said method comprising the steps of:

providing a crucible made from a first material having a melting temperature, said crucible further having an outer wall;

adhering a second material to said outer wall of said crucible to form a pattern thereon, said second material having a temperature of transformation that is less than said melting temperature of said first material;

coating said outer wall with said second material adhered thereto with a third material to substantially cover said second material wherein at least one portion of said second material extends through said third material to define at least one port in said third material, said third material having a melting temperature that is greater than said temperature of transformation of said second material;

heating said crucible with said second material adhered thereto and said third material coated thereon to said temperature of transformation, wherein said second material is transformed to a fluidic state; and removing said second material in said fluidic state via said at least one port in said third material.

2. A method according to claim 1 wherein said step of adhering comprises the step of applying a tape of said second material to said outer wall.

3. A method according to claim 1 wherein said step of adhering includes the step of forming said pattern as at least one contiguous run that extends along the length of said crucible.

4. A method according to claim 3 wherein said at least one contiguous run extends along the length of said crucible in a substantially straightline fashion.

5. A method according to claim 3 wherein said at least one contiguous run extends along the length of said crucible in a helical fashion.

6. A method according to claim 1 wherein said pattern comprises a plurality of runs of said second material.

7. A method according to claim 6 wherein at least a portion of said plurality of runs intersect one another.

8. A method according to claim 6 wherein at least a portion of said plurality of runs do not intersect with any other of said plurality of runs.

9. A method according to claim 1 wherein said step of coating comprises the step of electroplating said third material onto said outer wall with said second material adhered thereto.

10. A method according to claim 1 wherein said step of coating comprises the step of vapor depositing said third material onto said outer wall with said second material adhered thereto.

11. A method according to claim 1 wherein said step of removing comprises the step of manipulating said crucible so-coated and so-heated so that said second material in said fluidic state exits said at least one port in said third material.

12. A method according to claim 1 wherein said step of removing comprises the step of causing a pressure differential at said at least one port in said third material.

13. A method according to claim 12 wherein said pressure differential yields a pressure along at least a portion of said pattern that is greater than ambient pressure.

14. A method according to claim 12 wherein said pressure differential yields a pressure along at least a portion of said pattern that is less than ambient pressure.

15. A method of fabricating a protective coating for a crucible where the coating has channels formed therein, said method comprising the steps of:

providing an open-ended crucible made from a first material having a melting temperature, said crucible further having an outer wall;

adhering a tape to said outer wall of said crucible to form a pattern thereon, said tape having at least one free end extending from said outer wall, said tape having a temperature of transformation that is less than said melting temperature of said first material;

coating said outer wall with said tape adhered thereto with a second material wherein said at least one free end of said tape extends through said second material to define at least one port in said second material, said second material having a melting temperature that is greater than said temperature of transformation of said tape;

heating said crucible with said tape adhered thereto and said second material coated thereon to said temperature of transformation, wherein said tape is transformed to a fluidic state; and removing said tape in said fluidic state via said at least one port in said second material.

16. A method according to claim 15 wherein said step of adhering includes the step of placing said tape on said outer wall to define at least one contiguous run that extends along the length of said crucible.

17. A method according to claim 16 wherein said at least one contiguous run extends along the length of said crucible in a substantially straightline fashion.

18. A method according to claim 16 wherein said at least one contiguous run extends along the length of said crucible in a helical fashion.

19. A method according to claim 15 wherein said pattern is formed by a plurality of pieces of said tape.

20. A method according to claim 19 wherein at least a portion of said plurality of pieces intersect one another.

21. A method according to claim 19 wherein at least a portion of said plurality of pieces do not intersect with any other of said plurality of pieces.

22. A method according to claim 15 wherein said step of coating comprises the step of electroplating said second material onto said outer wall with said tape adhered thereto.

23. A method according to claim 15 wherein said step of coating comprises the step of vapor depositing said second material onto said outer wall with said tape adhered thereto.

24. A method according to claim 15 wherein said step of removing comprises the step of manipulating said crucible so-coated and so-heated so that said tape in said fluidic state exits said at least one port in said second material.

25. A method according to claim 15 wherein said step of removing comprises the step of causing a pressure differential at said at least one port in said second material.

26. A method according to claim 25 wherein said pressure differential yields a pressure along at least a portion of said pattern that is greater than ambient pressure.

27. A method according to claim 25 wherein said pressure differential yields a pressure along at least a portion of said pattern that is less than ambient pressure.

28. A method of fabricating a protective coating for a crucible where the coating has channels formed therein, said method comprising the steps of:

providing a crucible made from a first material, said crucible having an outer wall;

adhering a second material to said outer wall of said crucible to form a pattern thereon, said second material being different than said first material;

coating said outer wall with said second material adhered thereto with a third material to substantially cover said second material wherein at least one portion of said second material extends through said third material to define at least one port in said third material, said third material being different than said first material and said second material;

transforming said second material adhered to said crucible to a fluidic state; and removing said second material in said fluidic state via said at least one port in said third material.

29. A method according to claim 28 wherein said step of adhering comprises the step of applying a tape of said second material to said outer wall.

30. A method according to claim 28 wherein said step of adhering includes the step of forming said pattern as at least one contiguous run that extends along the length of said crucible.

31. A method according to claim 30 wherein said at least one contiguous run extends along the length of said crucible in a substantially straightline fashion.

32. A method according to claim 30 wherein said at least one contiguous run extends along the length of said crucible in a helical fashion.

33. A method according to claim 28 wherein said pattern comprises a plurality of runs of said second material.

34. A method according to claim 33 wherein at least a portion of said plurality of runs intersect one another.

35. A method according to claim 33 wherein at least a portion of said plurality of runs do not intersect with any other of said plurality of runs.

36. A method according to claim 28 wherein said step of coating comprises the step of electroplating said third material onto said outer wall with said second material adhered thereto.

37. A method according to claim 28 wherein said step of coating comprises the step of vapor depositing said third material onto said outer wall with said second material adhered thereto.

38. A method according to claim 28 wherein said step of removing comprises the step of manipulating said crucible so-coated and so-heated so that said second material in said fluidic state exits said at least one port in said third material.

39. A method according to claim 28 wherein said step of removing comprises the step of causing a pressure differential at said at least one port in said third material.

40. A method according to claim 39 wherein said pressure differential yields a pressure along at least a portion of said pattern that is greater than ambient pressure.

41. A method according to claim 39 wherein said pressure differential yields a pressure along at least a portion of said pattern that is less than ambient pressure.

* * * * *